United States Patent
Jinno

(10) Patent No.: US 7,163,833 B2
(45) Date of Patent: Jan. 16, 2007

(54) DISPLAY PANEL AND MANUFACTURING METHOD OF DISPLAY PANEL

(75) Inventor: Yushi Jinno, Gifu (JP)

(73) Assignee: Sanyo Electric Co., Ltd. (JP)

( * ) Notice: Subject to any disclaimer, the term of this patent is extended or adjusted under 35 U.S.C. 154(b) by 113 days.

(21) Appl. No.: 10/824,907

(22) Filed: Apr. 15, 2004

(65) Prior Publication Data

US 2004/0229387 A1    Nov. 18, 2004

(30) Foreign Application Priority Data

May 15, 2003    (JP)    ............................. 2003-137734

(51) Int. Cl.
 *H01L 21/00*    (2006.01)
 *G02F 1/1333*   (2006.01)
 *G02F 1/13*     (2006.01)
 *G01R 31/00*    (2006.01)

(52) U.S. Cl. .................. 438/30; 257/E21.596; 349/54; 349/192; 324/770

(58) Field of Classification Search .................. 438/14, 438/30, FOR. 434; 445/23; 324/770; 257/E21.596; 349/54, 192
See application file for complete search history.

(56) References Cited

U.S. PATENT DOCUMENTS 6,873,174 B1*   3/2005   Matsunaga et al. .......... 324/770
2002/0154079 A1* 10/2002  Shiota et al. .................. 345/87

* cited by examiner

*Primary Examiner*—Long Tran
(74) *Attorney, Agent, or Firm*—Cantor Colburn LLP

(57) ABSTRACT

An array test is performed during the process of panel formation, such as at a stage where a driving TFT which supplies a drive current for an organic EL element is completed and an anode of the organic EL element has been formed on the TFT. Then, with regard to a defective pixel, a line connecting the driving TFT and the anode is disconnected using a laser. After the line has been thus disconnected, a planarization insulating film is formed, and this film fills the holes caused by the laser irradiation. It is thus possible to suppress deterioration of pixels and also effectively darken a defective pixel using laser.

3 Claims, 3 Drawing Sheets

DISPLAY PANEL AND MANUFACTURING METHOD OF DISPLAY PANEL

BACKGROUND OF THE INVENTION

1. Field of the Invention

The present invention relates to manufacturing of an active matrix display panel including a display element and a thin film transistor (hereinafter referred to as TFT) which controls connection between the display element and a power source line, and more particularly to processing related to a defective pixel.

2. Description of Related Art

Organic electroluminescence (hereinafter referred to as "EL") display panels have been conventionally known as one type of flat display panel. Unlike liquid crystal display panels (LCDs), organic EL display panels are self-emissive. This feature, as well as their brightness and clarity, has fueled expectations of their widespread use.

Organic EL displays are composed of a great number of organic El elements, which function as pixels, arranged in a matrix. Further, of passive and active driving methods which can be used for organic EL elements as well as for LCDs, as is the case with LCDs, the active matrix method is also preferable for driving an organic EL element. More specifically, the active matrix method, in which a switching element provided for each pixel is controlled so as to control display of each pixel, is preferable because a higher resolution image screen can be realized than with the passive method, in which a switching element is not provided for each pixel.

An LCD display uses a single switching element (TFT), which is connected directly to a pixel electrode, whereas an organic EL panel uses two TFTs and one capacitor. FIG. 3 shows an example structure of a pixel circuit in an organic EL panel which uses conventional thin film transistors (TFTs). An organic EL panel is configured by arranging such pixels in a matrix.

Specifically, to a gate line extending in the row direction, a gate of a first TFT 10 which is an n-channel thin film TFT to be selected by the gate line is connected. A drain of the first TFT 10 is connected to a data line DL extending in the column direction and a source of the first TFT 10 is connected to one end of a storage capacitor CS. The other end of the storage capacitor CS is connected to a capacitor line SL which is a low voltage power source. Further, a connection point between the source of the first TFT 10 and the storage capacitor CS is connected to a gate of a second TFT 40 which is a p-channel thin film transistor. A source of the second TFT 40 is connected to a power source line VL and a drain of the second TFT 40 is connected to an organic EL element (EL). The other end of the organic EL element (EL) is connected to a cathode power source CV.

Accordingly, when the gate line GL is at H level, the first TFT 10 turns on, and the data then on the data line DL is stored in the storage capacitor. The current of the second TFT 40 is then controlled in accordance with the data (charge) stored in the storage capacitor CS, and current in accordance with the current of the second TFT 40 flows in the organic EL element EL, which then emits light.

While the first TFT is turned on, a video signal corresponding to that pixel is supplied to the data line DL. Thus, the storage capacitor CS is charged in accordance with a video signal supplied to the data line DL, whereby the second TFT 40 causes corresponding current to flow for controlling the brightness of the organic EL element EL. In other words, by controlling the gate potential of the second TFT 40 for controlling current to be supplied to the organic EL element, gray scale display for each pixel is performed.

In an organic EL panel as described above, the first TFT or the second TFT provided for each pixel may become defective. When these first and second TFTs have a defect, there is a possibility that a pixel is displayed as a luminous dot (a pixel which never becomes dark) or a dark dot (a pixel which never becomes bright), or that the data line DL connected to these TFTs is affected by generation of a short circuit, thereby causing a defect in the line. Accordingly, such a detective portion of the first TFT1 or the second TFT2 is conventionally separated from a line of connection so as to repair and normalize the pixel.

Although such a repair method results in a number of dark dots, this does not in itself significantly affect the usefulness of the organic EL panel as a product. In fact, a significant increase in production yields can be achieved by simply darkening luminous dots.

The above repair can be performed by disconnecting a line extending to the defective portion. More specifically, as in the case of LCDs, a line connecting the second TFT2 and the power source line or the pixel electrode may be disconnected using laser irradiation such as YAG laser.

In this manner, the defective portion can be separated from the lines and can be darkened, so that the problem concerning the overall display can be solved.

The repair treatment using YAG laser, however, results in formation of a deep hole in the panel. For example, when the line disconnection using YAG layer is performed in a stage where the TFTs are formed for each pixel, layers formed below the line is also blown off, where a deep hole is created. While organic layers and a cathode are to be formed subsequently in the case of an organic EL panel, these layers are too thin to sufficiently cover the hole. As a result, side surfaces of the organic layers of the organic EL element are also directly exposed to a space above the cathode, which may accelerate deterioration of the organic layers due to intrusion of moisture and may increase defective pixels.

In LCDs, when line disconnection is performed using a laser, as described above, not just the line but also other layers are removed and a hole is created where laser light is applied. As a result, side surfaces of each layer are exposed, often resulting in rapid deterioration and alignment disorders in a fine pixel device.

SUMMARY OF THE INVENTION

According to the present invention, before formation of a display element is completed, line disconnection is performed with regard to a defective pixel, and the defective pixel is darkened. Then, in the subsequent step of forming an insulating layer, a hole created by the line disconnection can be filled in. It is therefore possible to prevent the intrusion of moisture or the like in a completed display panel.

Further, according to the present invention, before formation of a display element is completed, a continuity test is performed, and line disconnection using laser, for example, is performed with regard to a defective pixel, and the defective pixel is darkened. Then, in the subsequent step of forming an insulating layer or the like, a hole created by the laser or the like can be repaired.

DETAILED DESCRIPTION OF PREFERRED EMBODIMENT

A preferred embodiment of the present invention will be described in further detail with reference to the accompanying drawings.

Figure 1:
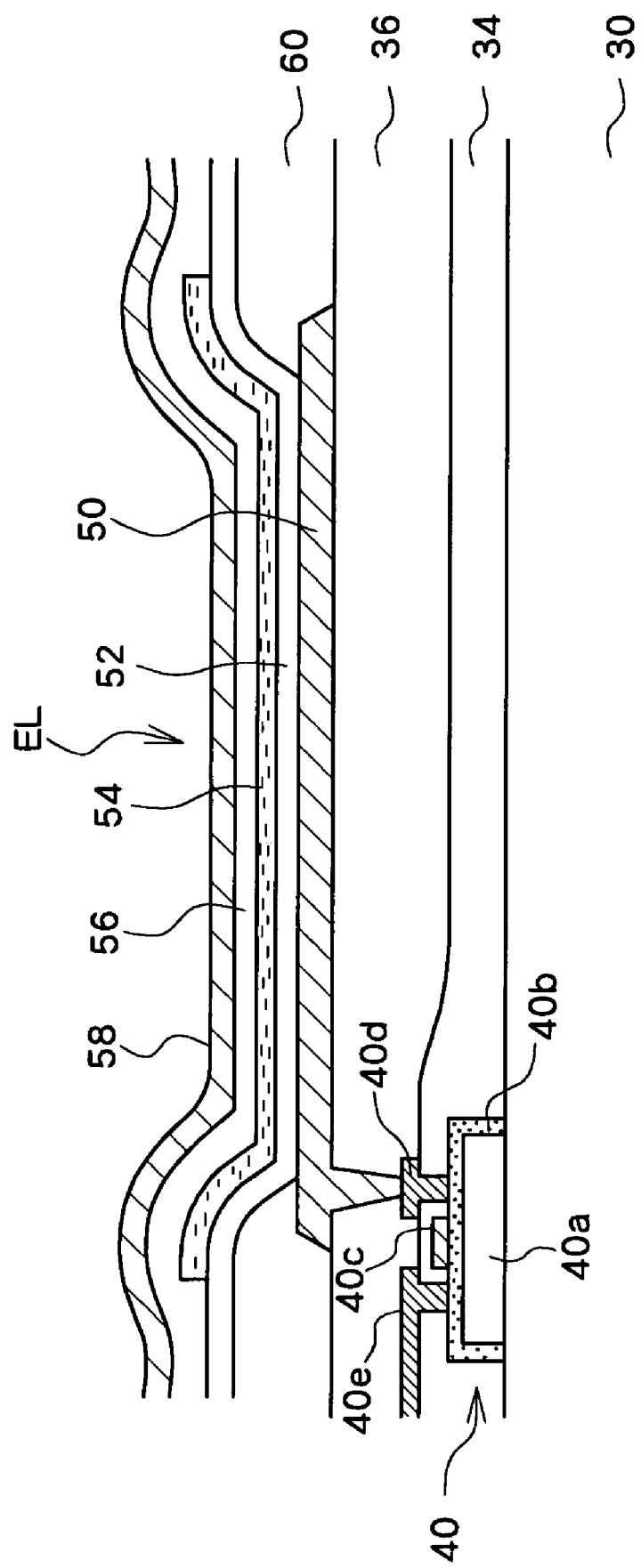
FIG. 1 shows a structure of a pixel portion.

Referring to FIG. 1, manufacturing of a display apparatus in accordance with an embodiment of the present invention will be described. First, a TFT is formed on a glass substrate 30. More specifically, an active layer 40a made of low temperature polycrystalline silicon is formed, and a gate oxide film of silicon oxide is formed on the surface of the active layer to form a gate electrode 40c. Then, impurities are doped in the active region 40a using the gate electrode 40c as a mask, thereby forming source and drain regions. Further, after an interlayer insulating film 34 is formed to cover the TFT, contact holes are formed in the interlayer insulating film 34 for forming a source electrode 40d and a drain electrode 40e. Then, a planarization insulating film 36 is formed, and a contact hole communicating with the source electrode 40d is formed in this planarization insulating film 36 to form an anode 50 made of ITO on the planarization insulating film 36.

In this manner, a circuit in which layers including the anode 50 of the organic EL element EL as the uppermost layer are formed is provided. At this stage, an array test is performed. In this array test, a predetermined signal is supplied to the gate line GL and the data line DL in a state where a predetermined power source voltage is applied to the power source line, and the accumulated charge of the storage capacitor CS and the parasitic capacitance Cdtr of the second TFT 40 at this time is measured. Namely, when the parasitic capacitance of the second TFT 40 has a predetermined value, the second TFT 40 is determined to be normal. It is therefore possible to inspect both the first and second TFTs 10 and 40 by measuring the charge accumulated in the second TFT 40.

It should be noted that, because the first TFT, the storage capacitor CS, and a peripheral drive circuit are also formed together with the second TFT 40, these circuits can be used to supply a test signal.

When a defective pixel is detected as a result of the above array test, the second TFT 40 and the power source line VL or the anode 50 (the periphery of the contact, for example) are disconnected with regard to the defective pixel. Specifically, when a defect such as generation of short circuit caused by abnormality of TFT is detected, such a defective portion is electrically separated for normalization.

Figure 2A:
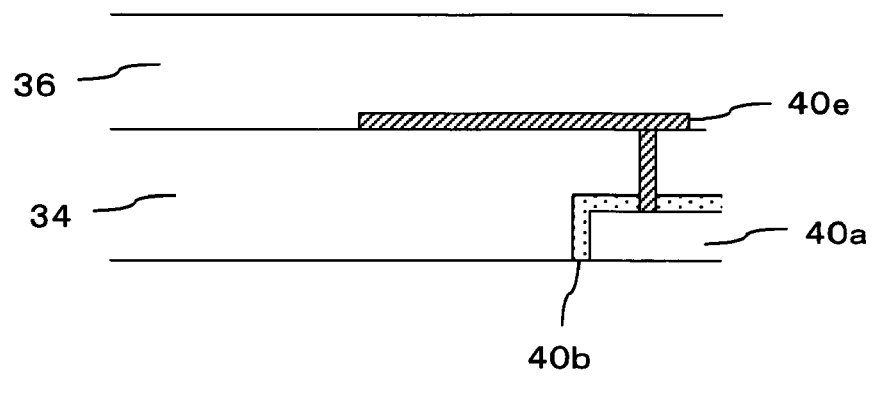
FIGS. 2(a), 2(b), and 2(c) explain a repair process using a laser.
Figure 2B:
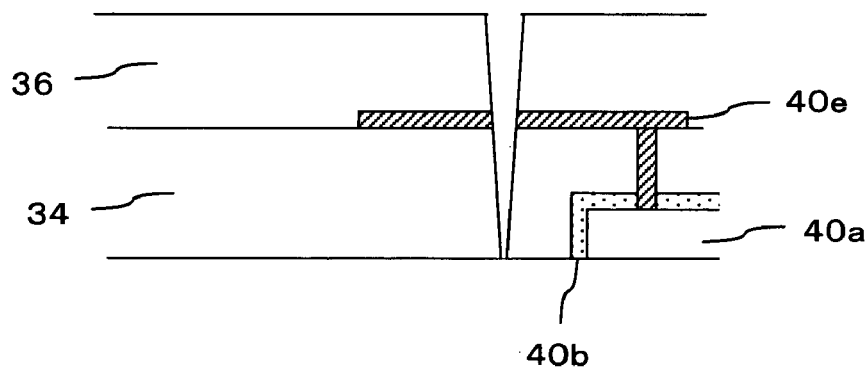

Still more specifically, as shown in FIG. 2(a), an array test is performed when the TFT, the first planarization insulating film 36, and then the anode 50 (not shown) are formed. With regard to defective pixels, each pixel is separated from the matrix circuit by disconnecting the connection line with laser irradiation. The laser irradiation may be applied from above in the figure or from below through the glass substrate 30. Consequently, as shown in FIG. 2(b), each layer is partially removed by laser, thereby creating a hole. In the illustrated example, the line between the power source line VL and the driving transistor 40 is disconnected.

Figure 2C:
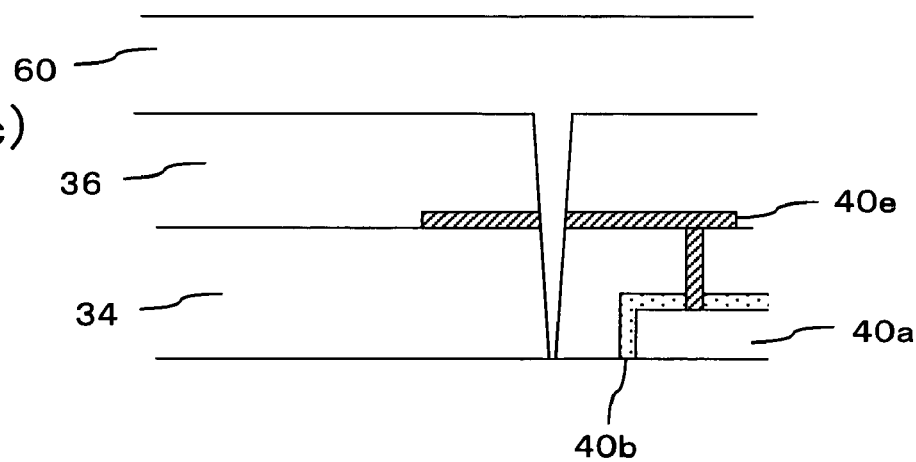
Figure 3:
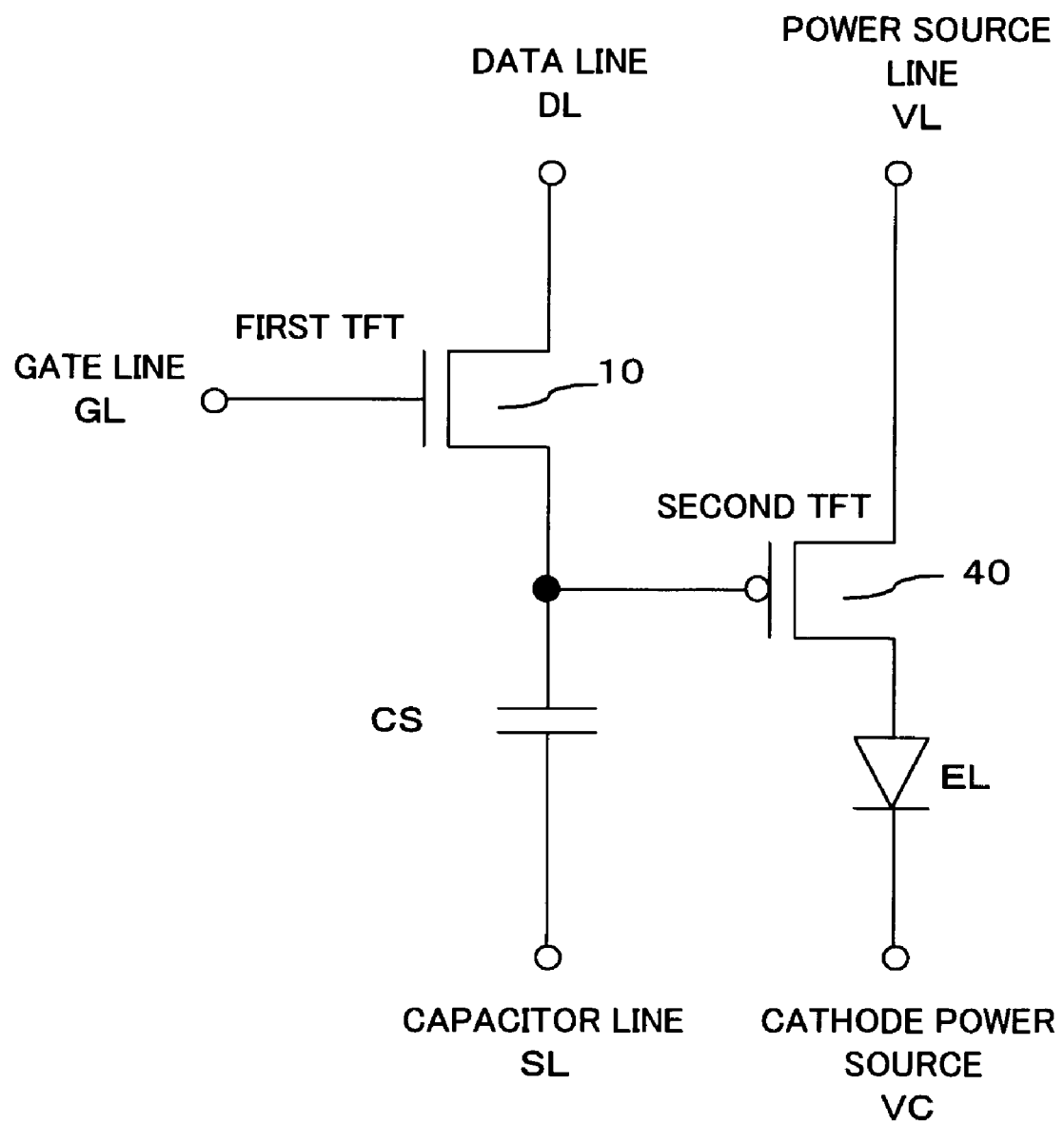
FIG. 3 shows a structure of a pixel circuit.

Then, by forming a second planarization insulating film 60, the hole which is created by the laser irradiation is filled as shown in FIG. 2(c).

Subsequently, after the portion of the second planarization insulating film 60 located above the anode 50 is removed, a hole transport layer 52, an organic emissive layer 54, an electron transport layer 56, and a cathode 58 are sequentially layered, thereby completing the element substrate. Further, when a sealing substrate having a sealing material attached to the peripheral portion is adhered to the element substrate, the organic EL panel is completed. Although the pixel shown FIG. 1, the organic emissive layer 54 is provided only in the region corresponding to the anode 50 and other layers are provided covering the entire surface of the substrate, the electron transport layer 56, which may include an emissive material such as Alq3, is often provided only in the region corresponding to the emissive portion similar to the organic emissive layer 54.

With regard to the laser irradiation, a YAG laser or the like having a wavelength of 64 nm or 533 nm is commonly employed. Laser light having the above wavelength can transmit through polycrystalline silicon of the TFT active layer for disconnecting the line layers formed above the active layer.

As described above, according to the present embodiment, an array test is performed at a stage where the anode is formed, and the line with regard to a defective pixel is disconnected using a laser, to thereby darken the defective pixel. According to the organic EL display apparatus of the present invention, because the thicker second planarization insulating film 60 is formed after formation of the anode 50, it is possible to fill the hole created by the laser repairing with the second planarization insulating film 60, such that any damage caused by the laser irradiation can be effectively repaired.

Alternatively, it is also possible to perform laser repairing after formation of both the drain and source electrodes and then fill the hole created by the laser irradiation in the process of forming the first planarization film or after that.

In particular, for an organic EL panel, the organic layer composed of the hole transport layer 52, the organic emissive layer 54, and the electron transport layer 56 forming the organic EL element is relatively thin, having a thickness of only approximately 200 nm, and therefore may not be able to fill the hole created by laser irradiation. According to the present embodiment, however, the hole can be effectively filled with the second planarization insulating film.

In this manner, organic EL panel production yields can be significantly increased by repairing defects in the line resulting from the TFT detect. Also, because the hole created by laser irradiation can be filled with an insulating material, it is possible to effectively prevent moisture and oxygen from reaching the organic layer through the hole during the use, thereby preventing deterioration of the organic layer and formation of dark spots.

Further, because the array test is performed with respect to a TFT-formed substrate (an element substrate) prior to the formation of the organic layer, an array tester which is used for LCDs can be used for an organic EL panel. Of course, an array tester specific to an organic EL may be used. In addition, a laser repairing apparatus used for irradiating laser and disconnecting the line, which is used for manufacturing LCDS, can also be used for manufacturing organic EL panels.

With regard to LCDS, substantially the same process as above can be used until the electrode of the TFT substrate is formed. More specifically, after the first TFT and the storage capacitor are formed on the glass substrate for each pixel, the pixel electrode is formed. At this stage, an array test is performed, and a defective pixel can be repaired using a laser.

While line disconnection using a laser is described in the above example, the present invention is not limited to the use of lasers, and an electron beam, FIB (Focused Ion Beam), or the like may also be used.

As described above, according to the present embodiment, a test is performed at a stage where the pixel electrode 50 is formed, namely in a stage prior to the formation of a relatively thick insulating film (the second planarization insulating film). Then, with regard to a defective pixel, lines are disconnected using a laser, to thereby separate the abnormal short-circuit portion and darken the defective pixel. Subsequently, when the second planarization insulating film 60 is formed in the necessary region, the hole created by the laser can be mended, thereby preventing intrusion of moisture or the like in a completed display panel.

Here, the second planarization insulating film 60 is patterned such that it has an opening in the portion corresponding to the center portion of the pixel electrode (anode) 50 and covers the edges of the pixel electrode 50. By simply leaving the second planarization insulating film 60 in the hole created by laser repairing, it is possible to cover the hole after the repairing process, and without performing any additional steps.

While the preferred embodiment of the present invention has been described using specific terms, such description is for illustrative purposes only, and it is to be understood that changes and variations may be made without departing from the spirit or scope of the appended claims.

What is claimed is:

1. A method of manufacturing an active matrix display panel which comprises, for each pixel, a display element and a thin film transistor for controlling connection between the display element and a power source line, the method comprising the steps of:

forming the thin film transistor on a substrate; and after formation of the thin film transistor, accumulating a plurality of layers to complete formation of the display element, wherein the step of accumulating a plurality of layers includes at least one step of forming a planarization insulating film having a large thickness and an insulating property, and the method further comprises, prior to the at least one step of forming a planarization insulating film, a step of disconnecting a line between the display element and the power source line with regard to a defective pixel.

2. A method according to claim 1, wherein the line disconnection is performed by laser irradiation.

3. A method according to claim 1, wherein the display element is an organic electroluminescence element.

* * * * *